United States Patent
Sam et al.

(10) Patent No.: US 10,141,533 B2
(45) Date of Patent: Nov. 27, 2018

(54) QUANTUM DOT-BASED LIGHTING SYSTEM FOR AN AIRCRAFT

(71) Applicant: B/E AEROSPACE, INC., Wellington, FL (US)

(72) Inventors: Luis Sam, South Setauket, NY (US); Eric Johannessen, Holbrook, NY (US); Brendan Upton, East Patchogue, NY (US)

(73) Assignee: B/E Aerospace, Inc., Wellington, FL (US)

( * ) Notice: Subject to any disclaimer, the term of this patent is extended or adjusted under 35 U.S.C. 154(b) by 0 days.

(21) Appl. No.: 15/690,578

(22) Filed: Aug. 30, 2017

(65) Prior Publication Data

US 2018/0123067 A1    May 3, 2018

Related U.S. Application Data

(63) Continuation-in-part of application No. 15/338,930, filed on Oct. 31, 2016, now Pat. No. 9,868,390.

(51) Int. Cl.

| H01L 51/50 | (2006.01) |
|---|---|
| B64D 47/02 | (2006.01) |
| H05B 33/08 | (2006.01) |
| H05B 37/02 | (2006.01) |

(52) U.S. Cl.
CPC ............ *H01L 51/502* (2013.01); *B64D 47/02* (2013.01); *H01L 51/5036* (2013.01); *H05B 33/0845* (2013.01); *H05B 37/02* (2013.01)

(58) Field of Classification Search
CPC ................ H05B 37/02; H05B 37/0254; H05B 37/0272; H05B 33/0857; H05B 33/086; G64D 11/00; G64D 47/02; G64D 2203/00; G64D 2011/0038; B60Q 3/46; B60Q 3/47; H04N 1/54; Y02B 20/48
See application file for complete search history.

(56) References Cited

U.S. PATENT DOCUMENTS

| 6,340,868 | B1 | 1/2002 | Lys et al. |
|---|---|---|---|
| 7,178,954 | B2 * | 2/2007 | Blechschmidt ........ B64D 11/00 244/118.5 |
| 7,352,339 | B2 | 4/2008 | Morgan et al. |
| 7,497,590 | B2 | 3/2009 | Rains, Jr. et al. |
| 7,821,194 | B2 | 10/2010 | Negley et al. |
| 8,240,875 | B2 | 8/2012 | Roberts et al. |
| 8,378,595 | B2 | 2/2013 | Eckel et al. |
| 8,564,205 | B2 | 10/2013 | Roberts et al. |

(Continued)

FOREIGN PATENT DOCUMENTS

WO    2013/140296 A1    9/2013

OTHER PUBLICATIONS

PCT Search Report and Written Opinion issued in related application PCT/US2017/058490, dated Apr. 10, 2018, 16 pages.

*Primary Examiner* — Haissa Philogene
(74) *Attorney, Agent, or Firm* — Donna P. Suchy

(57) ABSTRACT

An aircraft lighting system includes quantum dot light-emitting diodes ("QLEDs"), including a first QLED of a first color and a second QLED of a second color. The system also includes logic circuitry configured to control the QLEDs to emit light in a first brightness ratio to create a light of a first metamer of a color and control the QLEDs to emit light in a second brightness ratio to create a light of a second metamer of the color.

14 Claims, 12 Drawing Sheets

(56) References Cited

U.S. PATENT DOCUMENTS

| | | |
|---|---|---|
| 8,669,722 B2 | 3/2014 | Yeh et al. |
| 8,750,517 B2 * | 6/2014 | Kymissis .................. F41H 3/02 380/274 |
| 9,018,858 B2 | 4/2015 | Gambeski et al. |
| 9,185,765 B2 * | 11/2015 | Schmid .............. H05B 33/0857 |
| 9,497,820 B2 | 11/2016 | Gambeski et al. |
| 9,868,390 B1 * | 1/2018 | Sam ..................... B60Q 3/0259 |
| 2006/0066266 A1 | 3/2006 | Li Lim et al. |
| 2012/0099303 A1 | 4/2012 | Li et al. |

* cited by examiner

QUANTUM DOT-BASED LIGHTING SYSTEM FOR AN AIRCRAFT

CROSS-REFERENCE TO RELATED APPLICATIONS

This application is a continuation-in-part of U.S. application Ser. No. 15/338,930, filed Oct. 31, 2016 and incorporated herein by reference.

BACKGROUND

Color mixing schemes are used to provide lighting accents generally via indirect lighting (i.e., an area is illuminated primarily by light from the illumination source that is reflected off of another surface). Various moods may be created, particularly when colored lighting is used.

Advances in light emitting diode ("LED") technology has made LEDs an ideal source of light where low-powered lighting solutions are desirable, such as in an aircraft, where power availability is limited. Recently, new technologies have become available that have the potential to enhance the usefulness of LEDs generally, but which have not been fully realized in the context of aircraft lighting. Quantum dots are an example of one such technology.

SUMMARY

In an embodiment, an aircraft cabin lighting unit includes multiple quantum dot light-emitting diodes ("QLEDs"), including a first QLED of a first color, a second QLED of a second color, and logic circuitry (e.g., a microprocessor or microcontroller) configured to control the QLEDs to: emit light in a first brightness ratio to create a light of a first metamer of a color and emit light in a second brightness ratio to create a light of a second metamer of the color.

According to an embodiment, a lighting system for an aircraft cabin includes a cluster of quantum dots (e.g., arranged in the shape of a seat number) located on or near a visible surface within the aircraft cabin, a lighting device configured to emit light of a wavelength that is sufficient to excite the quantum dots to a state in which the quantum dots illuminate, and logic circuitry (e.g., a microprocessor or microcontroller) configured to control the lighting device to emit the light on a predetermined condition (e.g., during a passenger boarding process or when a passenger call button is pressed), thereby causing the quantum dots to illuminate.

In an embodiment, a method for controlling QLEDs in an aircraft cabin lighting unit involves a logic circuitry controlling QLEDs (including a first QLED of a first color and a second QLED of a second color) to emit light in a first brightness ratio to create a light of a first metamer of a color and to emit light in a second brightness ratio to create a light of a second metamer of the color.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

The following discussion is directed to various embodiments. However, one possessing ordinary skill in the art will understand that the examples disclosed herein have broad application, and that the discussion of any embodiments is meant only be an example of that embodiment, and not intended to suggest that the scope of the disclosure, including claims, is limited to that embodiment.

Certain terms are used throughout the following description to refer to particular features or components. As one skilled in the art will appreciate, different persons may refer to the same feature or component by different names.

An improved LED lighting assembly is disclosed herein. According to an embodiment, an LED lighting assembly adds additional LEDs with additional colors (e.g., orange, amber, etc.) to increase the size of the gamut, thus creating multiple solutions for each color point. The various solutions for each color point may be used to create different lighting schemes that vary with, for instance, time of day, a particular activity such as boarding the aircraft or serving food, or the like.

In an example embodiment, an LED lighting assembly includes at least a first LED of a first color, a second LED of a second color, a third LED of a third color, and a fourth LED and a fifth LED each having a white color. The LED lighting assembly further includes a logic circuitry configured to supply respective driving signals to each of the first, second, third, fourth, and fifth LEDs. The respective driving signals individually control relative intensity outputs of the various LEDs. The logic circuitry is further configured to display a desired color point by driving the fourth and the fifth LEDs and two of the first, second, or third LEDs while not driving the other one of the first, second, or third LEDs.

Figure 1B:
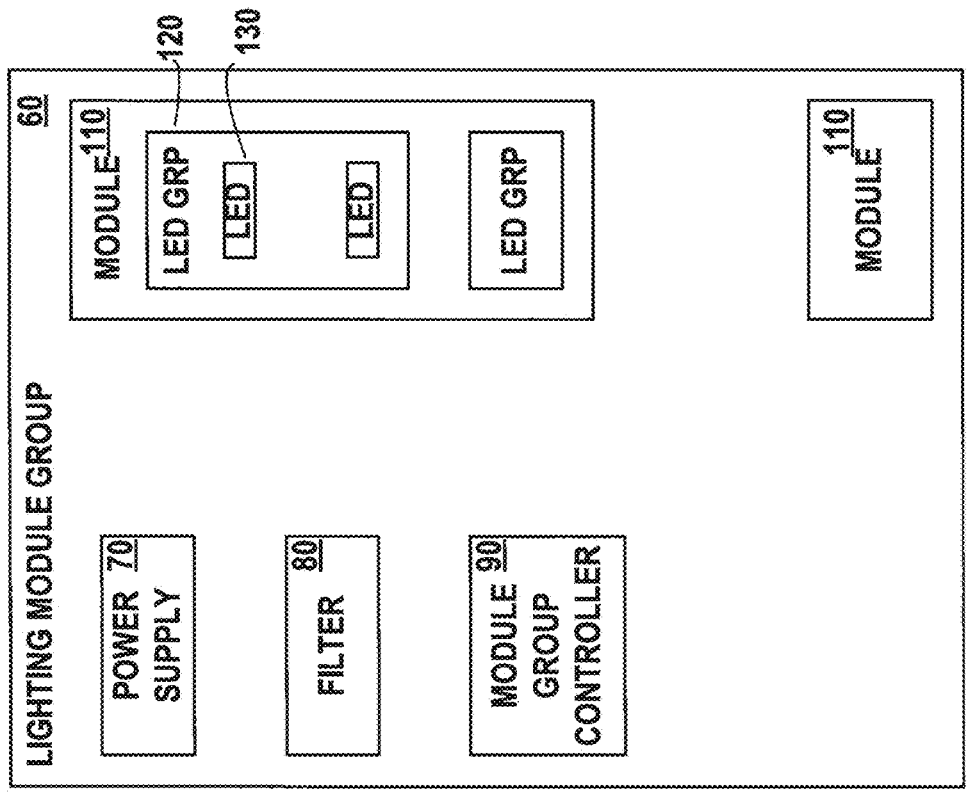
FIG. 1B is a block diagram illustrating the primary components of a lighting module group, according to an embodiment.
Figure 1A:
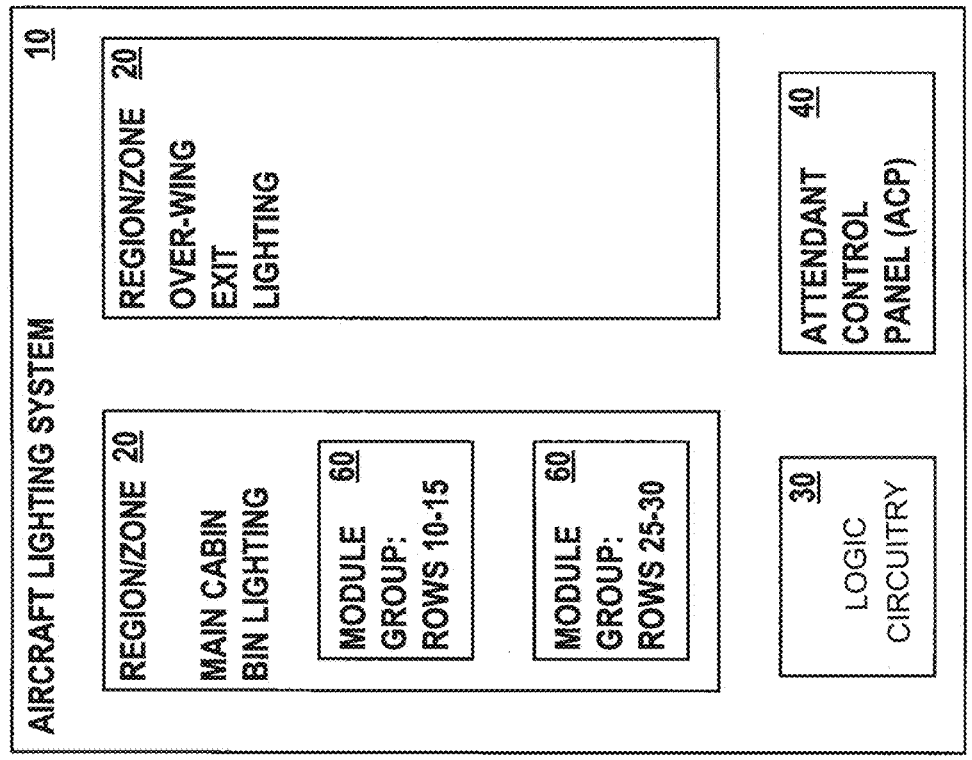
FIG. 1A is a block diagram illustrating a configuration of lighting system components, according to an embodiment.

FIG. 1 provides an example organization of a grouping hierarchy that may be used in the aircraft lighting system 10. The lighting system may be broken down into different addressable lighting regions 20 that could be used on an aircraft. For example, the regions on an aircraft could include: sidewall lighting, cross-bin lighting, over wing exit lighting, ceiling lighting, direct lighting, etc. The regional breakdown of the lighting system allows lighting control over broad areas of the aircraft.

Within each of these regions 20, one or more lighting module groups 60 may be provided. These module groups 60 may be fashioned as line replaceable units (LRUs) to enable quick assembly, maintenance, and replacement. For example, one module group 60 could be for the main cabin cross-bin lighting for rows 10-15.

The aircraft lighting system 10 further comprises logic circuitry 30 that can use, e.g., an attendant control panel (ACP) 40 as the primary user interface for attendants controlling the lighting during a flight (including on-ground parts of a flight), as well as for maintenance. The term logic circuitry here means a circuit (a type of electronic hardware) designed to perform complex functions defined in terms of mathematical logic. Examples of logic circuitry include a microprocessor, a controller, an application-specific integrated circuit, and a field-programmable gate array.

The LED modules in the system may be designed to be interconnected with one another into module groups. The lighting module groups 60 each comprise a power supply 70 that converts the aircraft power into a power usable by the module group 80, and may comprise a filter 80 for filtering out harmful noise and other signals. Each module group comprises a module group controller 90 that can intelligently handle high-level instructions from the logic circuitry 30 and possibly provide useful information back to the logic circuitry 30.

The lighting module group 60 may comprise one or more lighting modules 110 that each, in turn, comprises a plurality of LEDs 130 that may be organized in LED groups 120. Note that an individual LED 130 could belong to more than one group 120. For example, an LED 130 could be arranged according to one group based on the manufacturer, and could be arranged in another group based on its color.

Note that when the lighting module group 60 comprises a single lighting module 110, the characteristics (such as power supply 70, filter 80, and controller 90) can be associated with the module 110 itself. In other words, the lighting module group 60 and lighting module 110 could be construed as the same thing when there is only a single module 110 in the group 60.

Each module 110 can be designed to comprise one or more of the following: a) control circuitry 90 for controlling the module and possibly other attached slave modules 110' in a group 60; b) power supply circuitry 70 to enable an LED washlight to function off of, e.g., a 115 VAC, 400 HZ power source; and c) filtering circuitry 80 to filter incoming power to the modules and ensure that no problematic harmonic emissions, spikes or other undesirable power conditions are introduced back onto the aircraft power bus.

The LEDs 130 within a module can possibly be controlled individually, within specific groupings of LEDs 120 within a module, or collectively (all LEDs in a module). The groupings 120 can comprise arbitrary numbers of LEDs, or can be grouped according to area zones, color, LED characteristics, or other schemes.

In order for a lighting module 110 to produce specific desired color set points (which includes both color and intensity or luminous flux), multiple LEDs 130 of different types are used in combination such that their mixed light outputs produce the specific desired colors and the desired overall luminous flux. For example, a lighting module 110 may include LEDs 130 that produce colors in each of three primary colors red, green, blue, and white.

Figure 2:
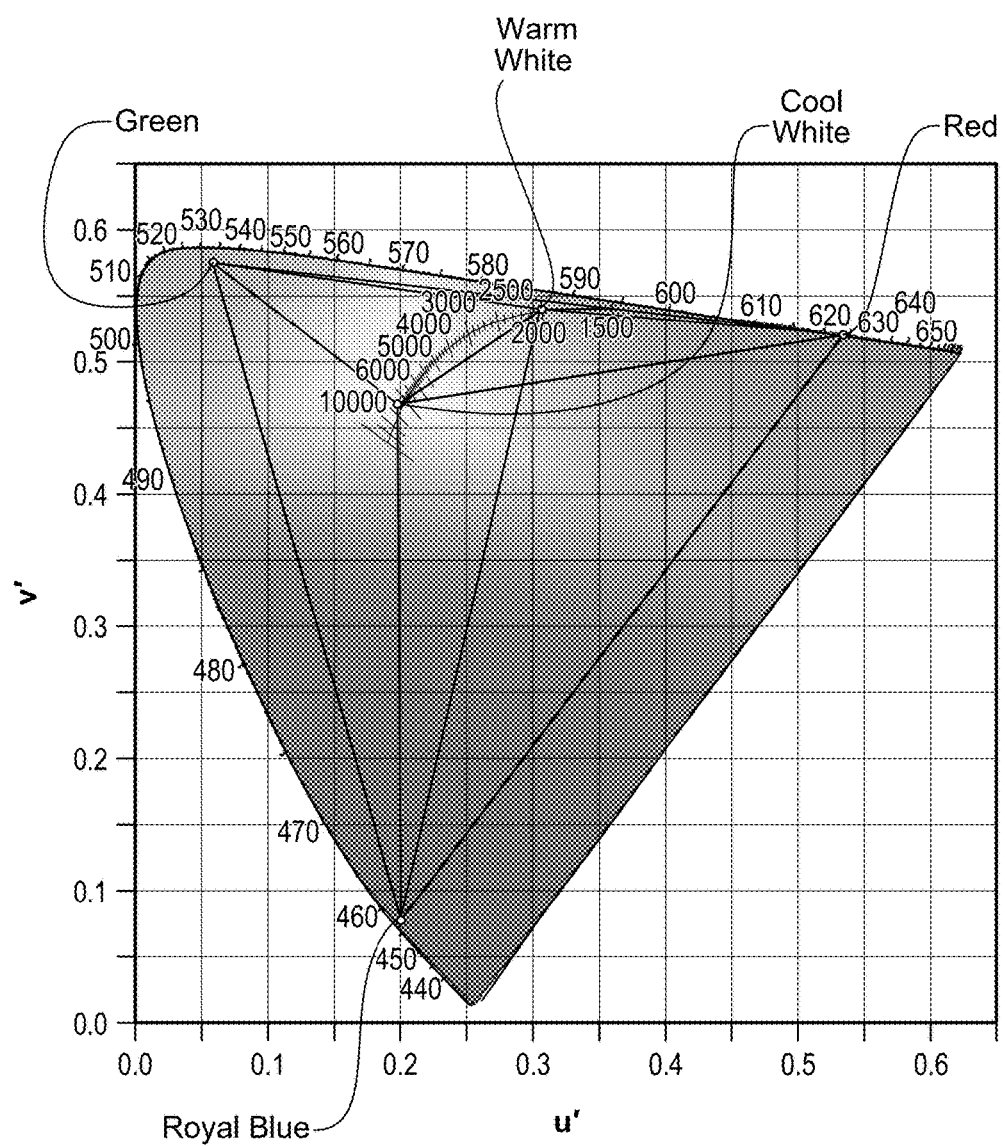
FIG. 2 illustrates a CIE 1976 chromaticity diagram according to an embodiment.

FIG. 2 illustrates a CIE 1976 chromaticity diagram in accordance with one embodiment. In a lighting module 110 that includes red, green, blue, cool white, and warm white LEDs, a specific desired color set point on the chromaticity diagram may be realized by mixing different intensities of each of the red, green, blue, cool white and warm white LED light outputs together.

Figure 3:
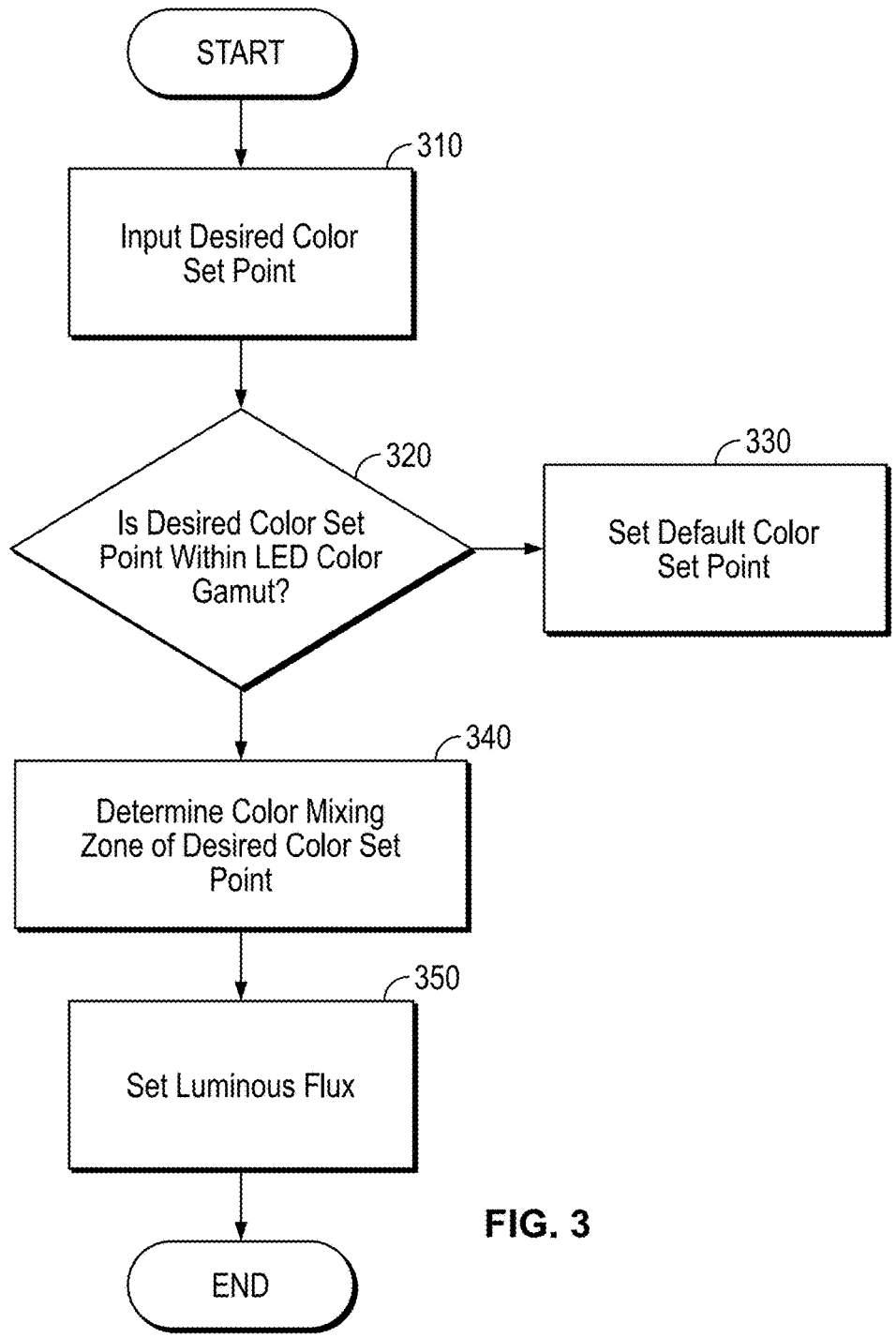
FIG. 3 illustrates a method of mixing the light output from multiple LEDs of different colors to produce a desired color set point, according to an embodiment.

FIG. 3 illustrates a method of mixing the light output from multiple LEDs 130 of different colors to produce a desired color set point. The method of FIG. 3 may be performed by the logic circuitry within the LED lighting module 110 and be employed during operation of the lighting module 110. In additional embodiments, the method may be performed by a logic circuitry within the module group controller 90, or other location which controls the LEDs 130 of the LED lighting module 110.

In a step 310, a desired color set point on the CIE 1976 chromaticity diagram $(x_d, y_d)$ for the LED lighting module 110 is input. In a step 320, a determination is made as to whether the desired color set point $(x_d, y_d)$ is within the color gamut of the LEDs 130 of the LED lighting module 110. If the desired color set point $(x_d, y_d)$ is determined to not be within the color gamut of the LEDs 130 of the LED lighting module 110, in step 330, a default light output mixture of the multiple LEDs 130 may be set, such as all on at 25% power, 50% power, 75% power, 90% power, or 100% power. Alternatively, during operation of the LED lighting module 110, in step 330, a color reasonably close or closest to the desired color set point which is within the color gamut of the LEDs 130 may be chosen, and the method may continue to step 340.

In a step 340, which one or more color mixing zones defined by the plurality of different color LEDs 130 of the LED lighting module 110 within which the desired color set point lies is determined. The method for determining the one or more color mixing zones in accordance with step 340 according to one embodiment will be described in more detail with reference to FIGS. 4-9.

Figure 4:
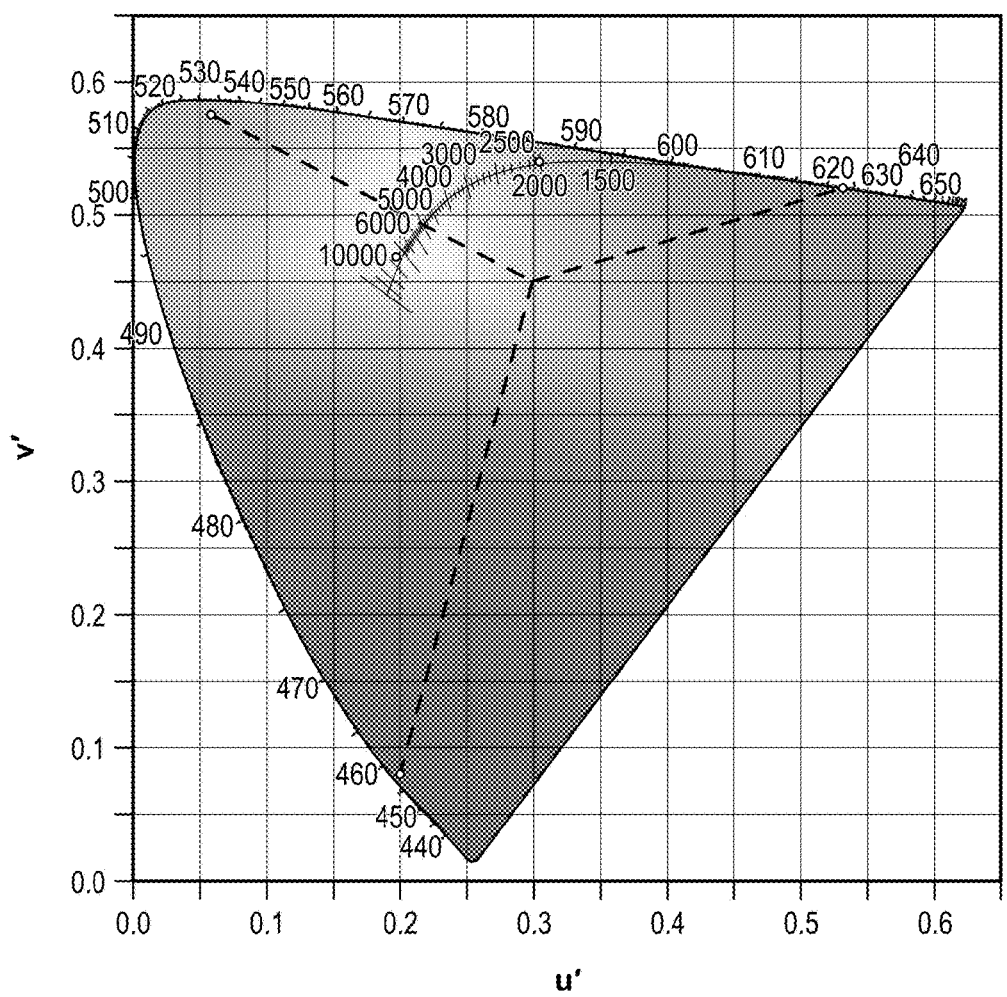
FIG. 4 illustrates a CIE 1976 chromaticity diagram depicting a first step of the method of mixing colors according to an embodiment.
Figure 5:
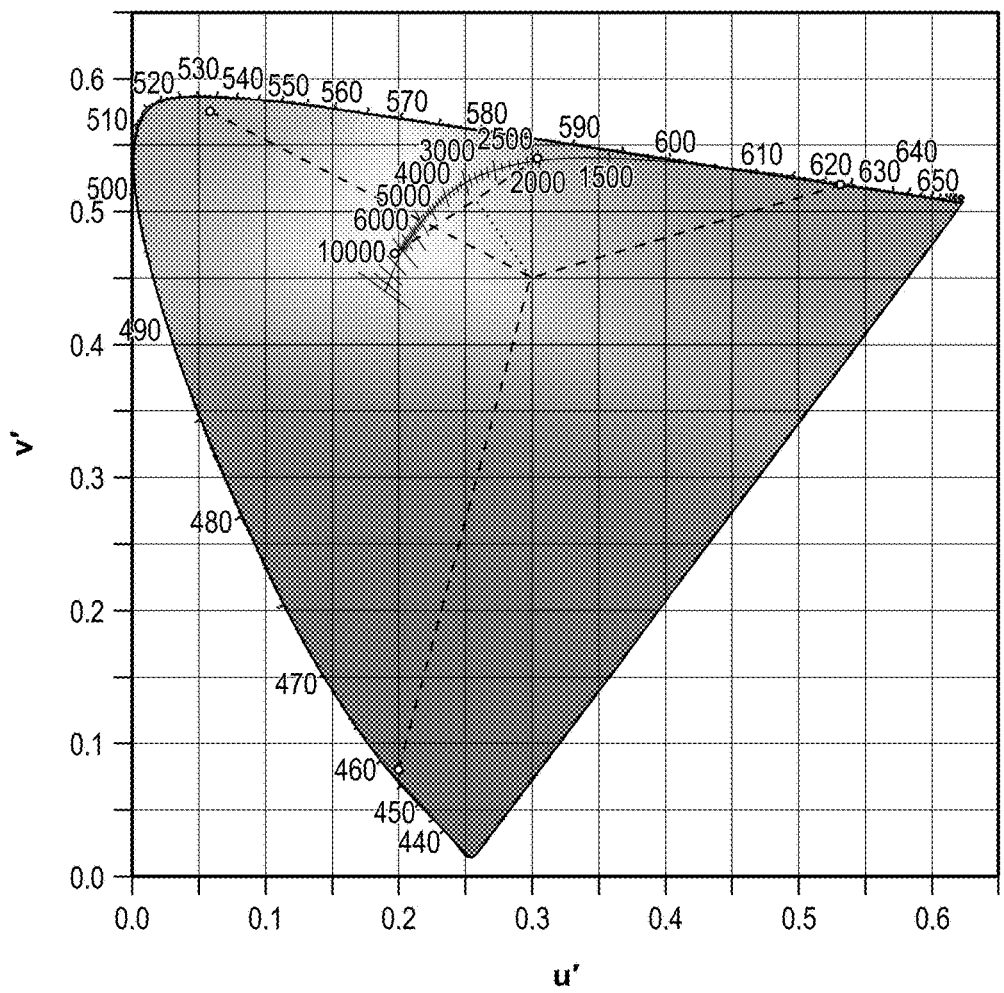
FIG. 5 illustrates a CIE 1976 chromaticity diagram depicting a second step of the method of mixing colors according to an embodiment.

Turning to FIG. 4, a CIE 1976 chromaticity diagram is illustrated with the three primaries (Red, Green, and Blue) forming the triangle. The logic circuitry creates ratio-metric mix of the primaries for the desired color point. This point may be referred to as $D_{RGB}$. Next, in FIG. 5, the CIE 1976 chromaticity diagram of FIG. 2 including the two additional white LEDs (cool white and warm white) is illustrated. According to the embodiment, the logic circuitry determines the intersect point from the desired color point $(D_{RGB})$ to the gamut formed by the two whites (WW line). In an embodiment, the shortest distance from $D_{RGB}$ to the WW line is used by the logic circuitry to determine the intersect point. In an embodiment, the logic circuitry may bias the intersect point by a predetermined amount (e.g., 10%) towards the warm white than the shortest distance to improve the color rendering index (CRI) of the resulting mix. According to some embodiments, the logic circuitry biases the intersect point to ensure that it does not coincide with one of the white points. This ensures that both white LEDs are on at all times, thereby increasing the overall efficiency and CRI of the color mixing system.

Figure 6:
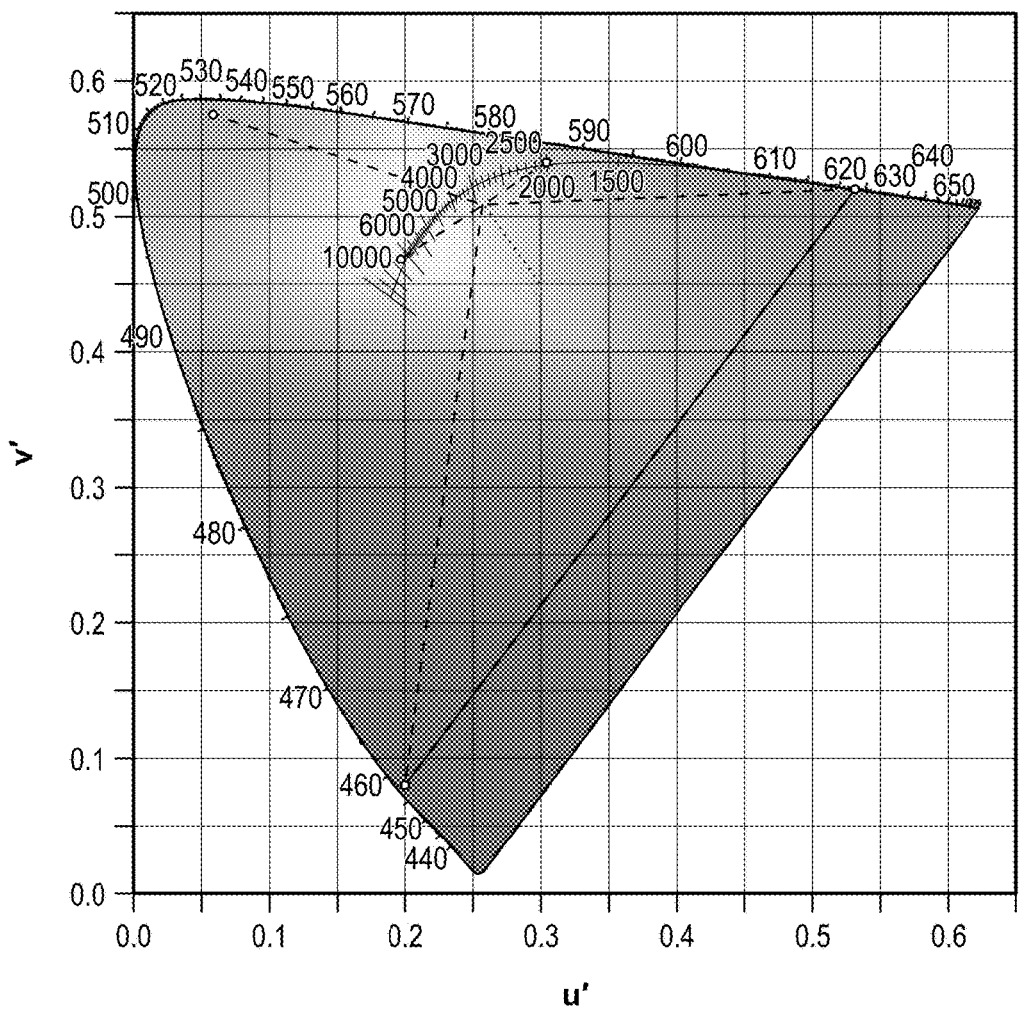
FIG. 6 illustrates a CIE 1976 chromaticity diagram depicting a third step of the method of mixing colors according to an embodiment.
Figure 7:
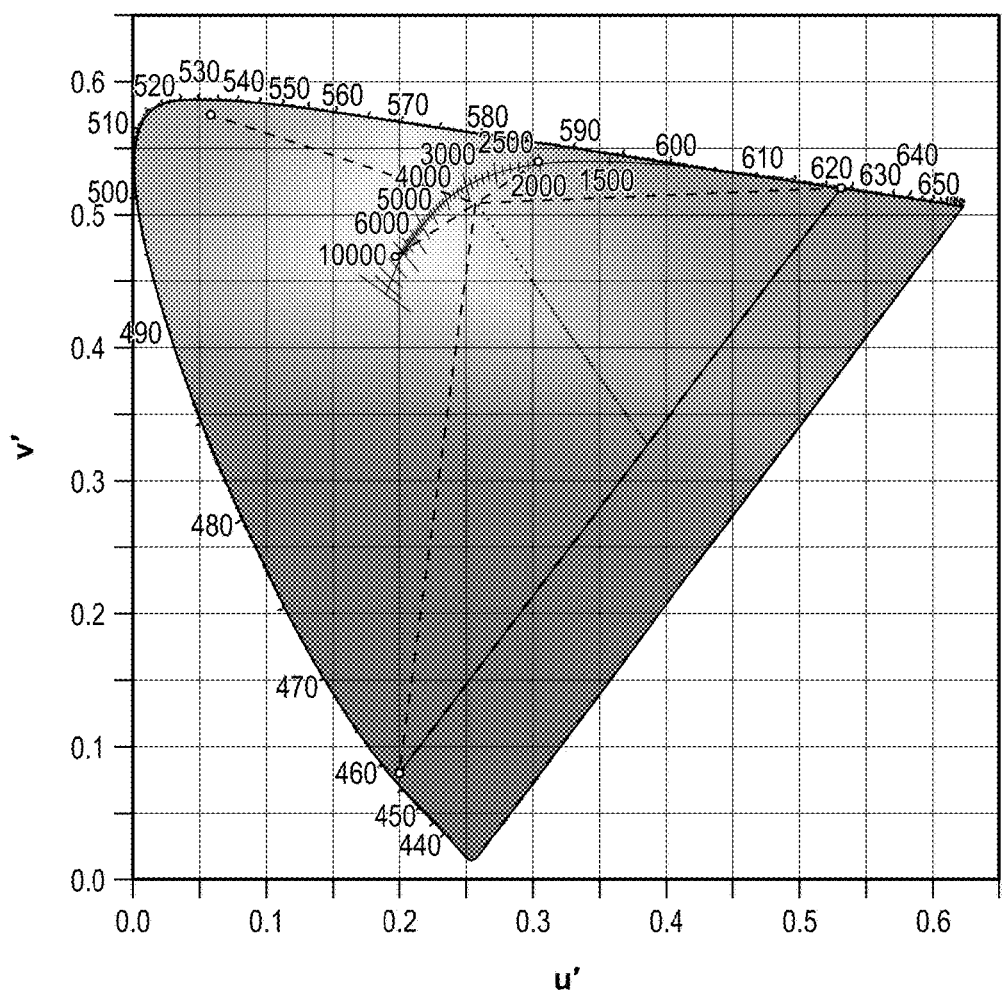
FIG. 7 illustrates a CIE 1976 chromaticity diagram depicting a fourth step of the method of mixing colors according to an embodiment.
Figure 8:
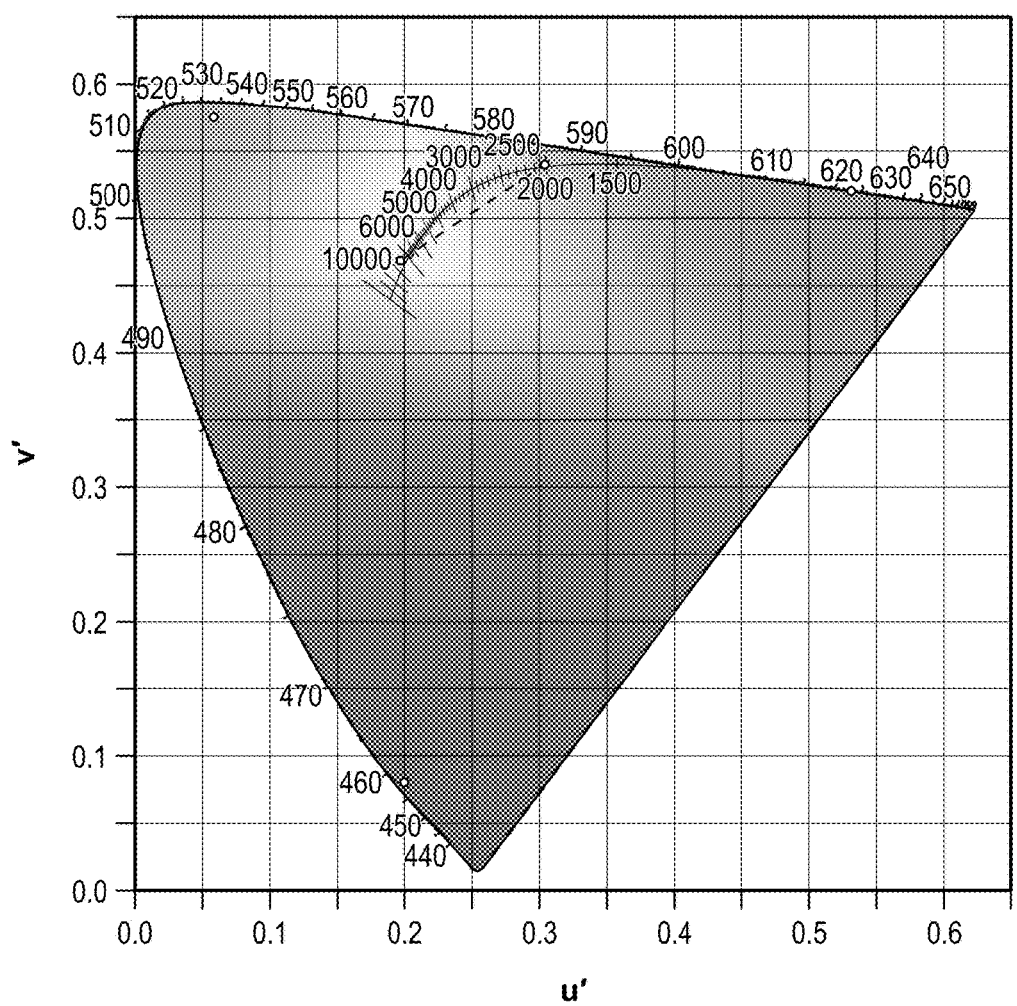
FIG. 8 illustrates a CIE 1976 chromaticity diagram depicting a fifth step of the method of mixing colors according to an embodiment.
Figure 9:
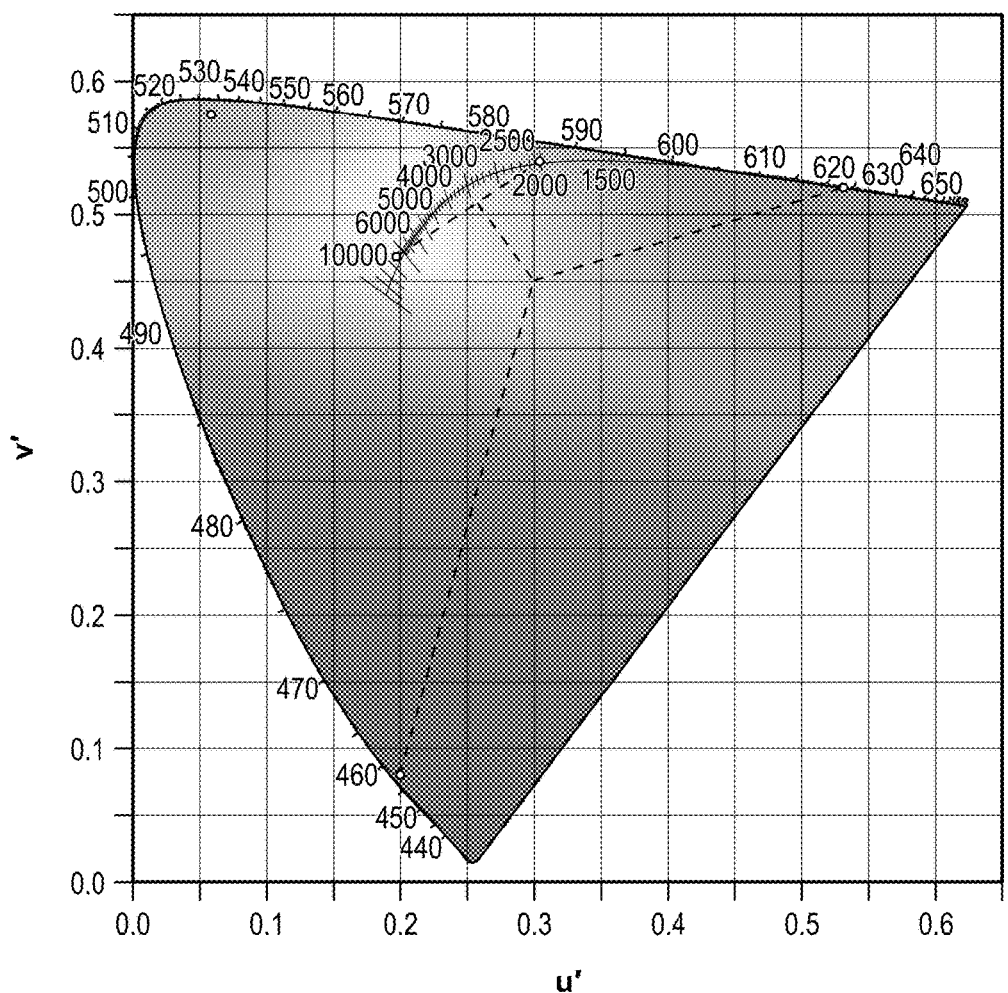
FIG. 9 illustrates a CIE 1976 chromaticity diagram depicting a sixth step of the method of mixing colors according to an embodiment.

Next, as illustrated in FIG. 6, a ratio-metric mix of primaries (RGB) for the intersection point with the while line is created by the logic circuitry. This point may be referred to as $W_{RGB}$. The processor then subtracts $W_{RGB}$ from $D_{RGB}$ until one of the primaries of $D_{RGB}$ goes to zero. As shown in FIG. 7, this "pushes" the color point away from $W_{RGB}$ until one of the colored LEDs is removed (Green in this instance). The resulting point may be referred to as Sat-$D_{RGB}$. Next, the processor creates a mix of the warm white and cool white LEDs to produce a metameric equivalent of the color point $W_{RGB}$ as show in FIG. 8. This color point may be referred to as $W_{WW}$. Finally, according to the embodiment, the logic circuitry adds the same proportion of $W_{WW}$ that was removed previously (as shown in FIG. 7) to the $D_{RGB}$ color mix. As illustrated in FIG. 9, this "pulls" the color point back toward $W_{RGB}$. The resulting color point is a metameric equivalent of the $D_{RGB}$, with the white mix substituting for one of the colored LEDs (Green in this instance).

Figure 10:
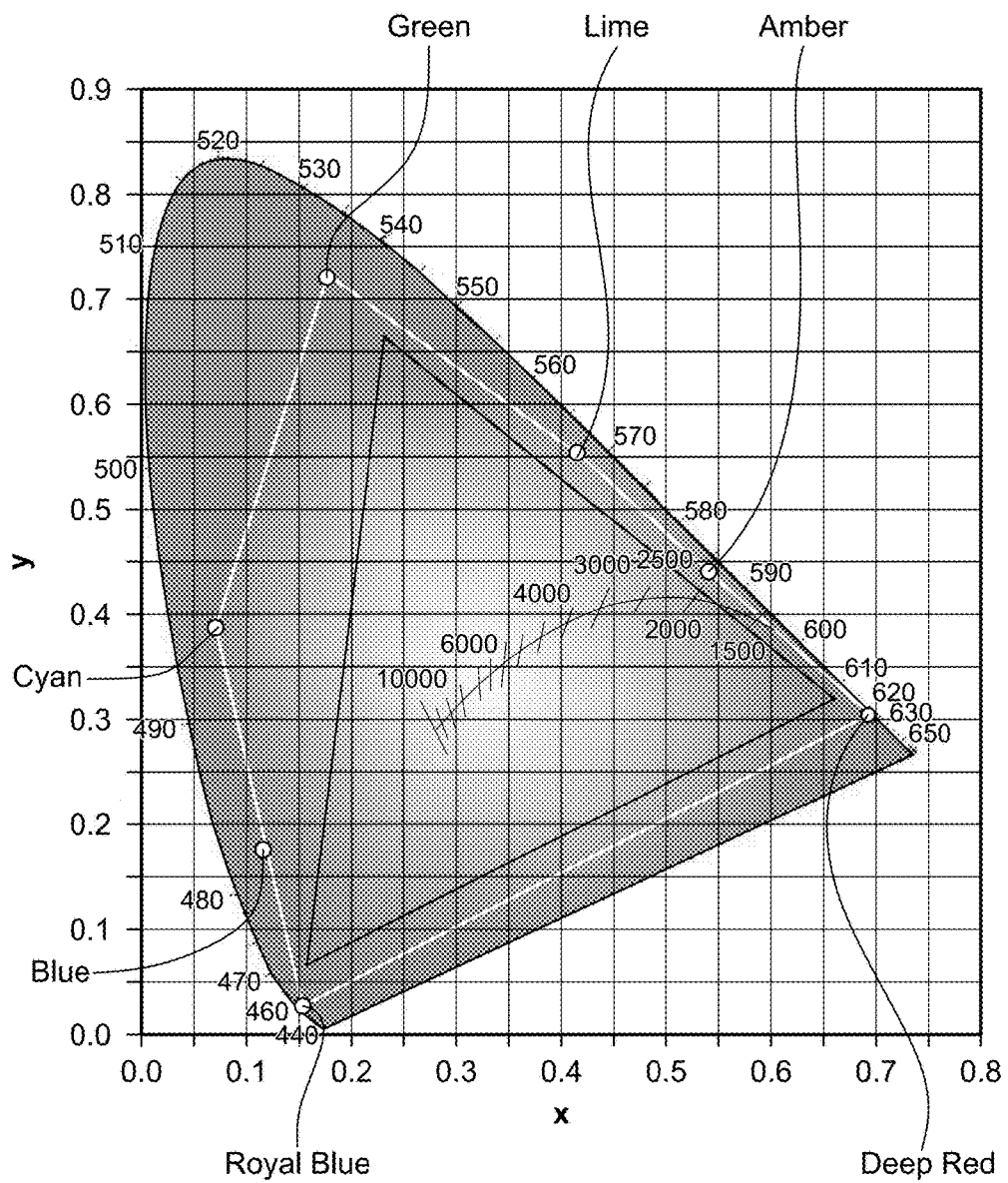
FIG. 10 illustrates a CIE 1931 chromaticity diagram having multiple colored LEDs according to an embodiment.

A person skilled in the art will appreciate that the logic circuitry may substitute the white mix for any of the colored LEDs based on the desired color mix. For instance, as illustrated in FIG. 10, the logic circuitry may drive the LEDs to obtain a lime color or an amber color by driving the royal blue content to null and replacing it with the white mix or obtain a cyan color by driving the deep red content to null. In various embodiments, the logic circuitry may obtain the metameric equivalents for the same color (for example, creating a warmer white which makes food appear more appetizing or creating a brilliant white with increased royal blue content which may make objects appear brighter) and appropriately drive the LEDs based on the desired needs.

Returning to FIG. 3, once the logic circuitry determines the appropriate color mix ratios in step 340, in a step 350, the luminous flux ratios of each of the LEDs 130 in the LED lighting module 110 are set according to the determined color mixing zone to produce the desired color set point. For example, if the desired set point is determined in step 340 to not contain any red color content, the luminous flux ratio of the red (R) LEDs 130 would be set to substantially zero, and the luminous flux ratios of each of the green (G), blue (B), cool white and warm white (W) LEDs 130 would be set appropriately to mix to produce the desired color set point on the chromaticity diagram.

According to various embodiments, the LED lighting assembly described above may create various moods using the multiple solutions generated for each color point. For instance, it may be preferable to obtain a cooler orange during sunset, or to obtain a warmer orange during sunrise. In an embodiment, the logic circuitry includes a user interface such as the ACP 40. The logic circuitry may be configured to receive an input indicating a desired color point (e.g. white) via the ACP 40. The logic circuitry may additionally be configured to receive an indication of a mood associated with the desired color point via the ACP 40. For instance, a warmer white may be desired when serving food to make the food appear more appetizing, while a brilliant white may be desired at boarding to give a brighter look to the cabin. In another embodiment, the ACP 40 may be configured to receive an indication associated with an event (e.g., food, boarding, de-boarding, sunrise, sunset, etc.) and determine the desired color point based on the selected event.

The LED lighting assembly, upon receiving the desired color point and mood associated with the desired color point, drives the LEDs according to the color mixing scheme described above with reference to FIGS. 4-9. Accordingly, in an embodiment, when a brilliant white is selected via the user interface, the logic circuitry drives the various LEDs to obtain a white color with increased royal blue content, whereas when a warmer white is desired, the logic circuitry drives the various LEDs to obtain a metameric equivalent of the white color that includes increased deep red content. In an embodiment, the logic circuitry may have predetermined desired color points stored therein that are associated with specific events or time of day.

A person skilled in the art will further understand that the embodiment described with reference to FIGS. 4-9 is not limited to using RGB primaries, and that any number of colored LEDs may be used to obtain the desired color gamut. According to an embodiment, the above color mixing method may be repeated for each additional color over three for as many colors as desired. In an embodiment, the logic circuitry accounts for the changes in luminous flux of the LEDs based on the age of the respective LEDs and adjust the color mixing ratios appropriately. For instance, in an embodiment, the primary LEDs consist of an Amber LED, a Cyan LED, a Magenta LED, and an Orange LED. A person skilled in the art will appreciate that additional color LEDs may be provided as part of the primary LEDs.

Similarly, one embodiment has been described above as having a cool white LED and an warm white LED. A person skilled in the art will understand that additional variations of white LEDs may be used instead without deviating from the scope of the disclosure. As discussed above, the ability to provide additional LEDs as part of the primary LEDs and driving the white LEDs to be constantly on results in a high resolution dimming (i.e., no perceivable steps) and CRI levels at approximately 99. In addition, the ability to use multiple LEDs provides the largest color gamut outputting any saturated color mix as well as high quality secondary colors such as cyan, pink, etc.

The system or systems may be implemented on any general purpose computer or computers and the components may be implemented as dedicated applications or in client-server architectures, including a web-based architecture. Any of the computers may comprise a processor, a memory for storing program data and executing it, a permanent storage such as a disk drive, a communications port for handling communications with external devices, and user interface devices, including a display, keyboard, mouse, etc. When software modules are involved, these software modules may be stored as program instructions executable on the processor on media such as tape, CD-ROM, etc., where this media can be read by the computer, stored in the memory, and executed by the processor.

For any of the embodiments described above, the LEDs may be implemented as quantum dot LEDs (QLEDs). As used herein, the term "quantum dots" refers to semiconductor particles of nanometer-scale dimensions, which emit light of specific frequencies if electricity or light is applied to them. The frequency of the emitted light depends on the size of the quantum dots. For example, quantum dots that are larger (e.g., a radius of 5-6 nm) emit light of longer wavelengths such as orange or red light. Smaller quantum dots (e.g., a radius of 2-3 nm) emit light of shorter wavelengths, resulting in colors like blue and green.

Some quantum dots are composed of regions of one material buried in another with a larger band gap. These so-called core-shell structures may include, for example, CdSe in the core and ZnS in the shell. Other compositions include special forms of silica called ormosil.

According to an embodiment, a type of QLED that may be used in the examples described herein includes (in order of layers) an aluminum cathode, a zinc oxide electron transport layer, a plurality of quantum dots (e.g., a spherical CdSe core surrounded by a ZnS shell) a polymeric triphenyldiamine hole transport layer, a transparent indium-tin oxide (ITO) anode, and a glass substrate.

Figure 11:
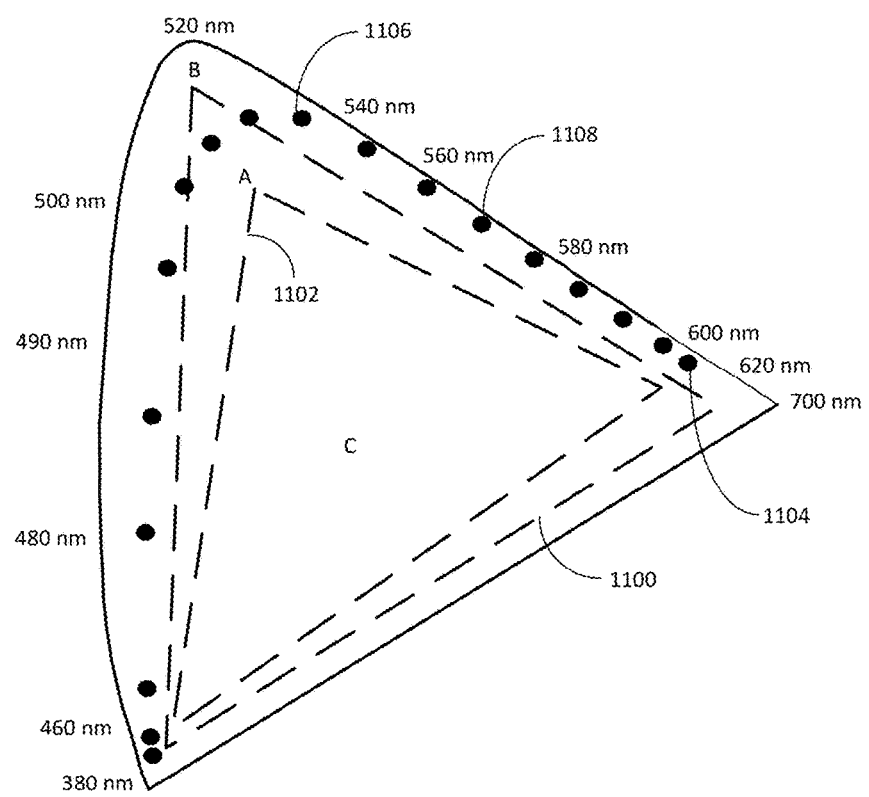
FIG. 11 illustrates a CIE 1976 chromaticity diagram that illustrates the color gamut for quantum dot based lighting, according to an embodiment.

One of the advantages of using quantum dots is that there is little or no color variation among dots. Another is that they emit light in very narrow bands and therefore allow for larger color gamuts. Referring to FIG. 11, for example, conventional green LEDs generally have wavelengths from 500 nm to 550 nm. Such a mix of green LEDs results in a color point A but not B. When mixing lights, quantum dot lights (e.g., QLEDs) result in a color gamut 1100, which is considerably larger than that of the typical color gamut 1102 of regular LEDs.

Another advantage is that one could create, for example, white light without using phosphor-coated LEDs, which are known to waste energy in the form of infrared emissions.

For example, if the goal to create a yellow LED that has a very high CRI, one could mix quantum dots from red at point 1104 all the way to green at point 1106. The result would be a yellow color at point 1108 that is very full and has a high CRI. Additionally, one could mix the yellow with a single blue to create a variable white that has color rendering and good efficiency.

Similarly, if the goal is to create a white light having a high CRI of 100, one could use red quantum dots (e.g., that emitted 600 nm light), lime quantum dots (e.g., that emitted 560 light), green, cyan, and blue, resulting in a full spectrum of colors to create white.

According to an embodiment, the logic circuitry 30 controls two or more lights (QLEDs or a combination of QLEDs and phosphor LEDs) (e.g., white phosphor LEDs) to mix them to create metameric equivalents of various colors. Metameric equivalents are colors having different wavelength components, but which appear the same to the human eye. Thus, for example, controlling the lights to emit red, green, and blue light in a first ratio and in a second ratio results in first and second metamers of white light respectively. Non-overlapping color pairs may also result in metameric equivalents. For example, the logic circuitry 30 may control the lights to emit green and magenta in a particular ratio, resulting in a first metamer of white light, and control the lights to emit blue and yellow light in a particular ratio to create a second metamer of white light. As long as the resulting mix falls in the center of the gamut (e.g., at point C), then a human will perceive white. Other light combinations that the logic circuitry 30 could accomplish include mixing blue and a broad spectrum phosphor white LED.

Other possible uses for the quantum dots in include night vision imaging system.

Other possible uses cases include lighting devices that have, for example, quantum dot film or a quantum dot based mix of encapsulant, in which the quantum dots are only excited by light of a blue wavelength, and emit green. If the logic circuitry only turns on the red LEDs, then nothing green shows up. If, on the other hand, the logic circuitry turns on the blue LEDs, the quantum dots will glow green. As a result, one could create a complex light that absorbs certain wavelengths of light and absorbs others.

According to an embodiment, the aircraft cabin has one or more clusters of quantum dots proximate to a visible surface (e.g., painted on the surface with epoxy, embedded within a transparent or translucent encapsulant (such as a polymer, like a diffuse plastic) formed into a desired pattern and attached to the surface). The aircraft cabin also includes a lighting device (e.g., the light 1204 shown in FIG. 12) that is configured to emit light of a wavelength that is sufficient to excite the quantum dots of the one or more clusters to emit light of a specific wavelength. The quantum dots may be front lit (e.g., from the lighting device 1204) or back lit. Using quantum dots or quantum dot LEDs in this manner eliminates a considerable amount of electrical infrastructure.

Figure 12:
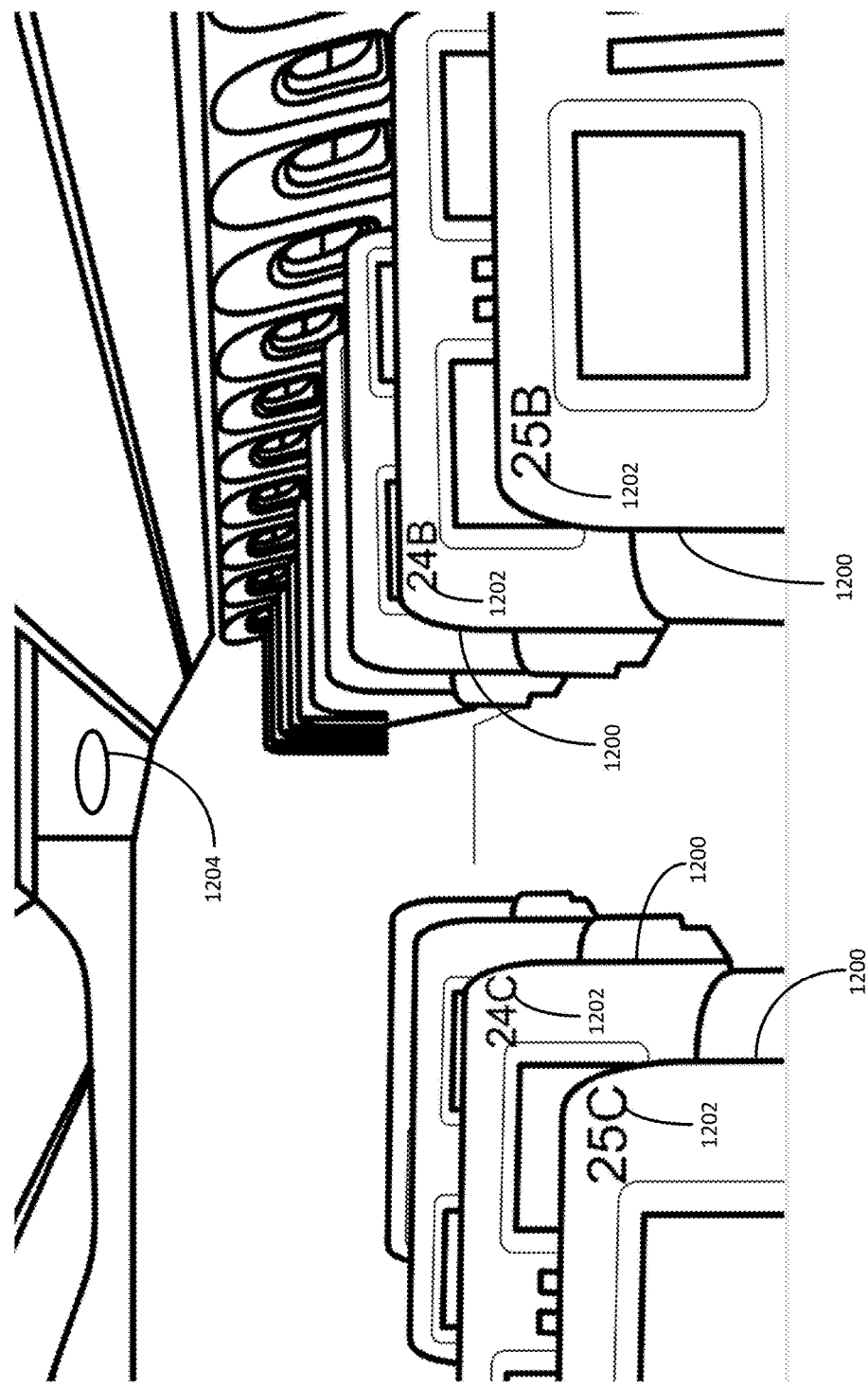
FIG. 12 illustrates an aircraft cabin in which an embodiment of the disclosure is deployed.

Turning to FIG. 12, an embodiment in which quantum dots are used on an aircraft will now be described. FIG. 12 depicts an aircraft cabin with multiple seats 1200. On each seat 1200 is a seat number 1202 that is made up of a cluster quantum dots disposed proximate to (e.g., on or embedded in material that is on) a visible surface of the seat. A lighting device 1204 is also located in the cabin. The lighting device 1204 is controlled by logic circuitry 30 to emit light of a frequency (e.g., ultraviolet light) to excite the quantum dots on a particular condition. For example, in one implementation, the logic circuitry 30 is configured to cause the lighting device 1204 to emit ultraviolet light during boarding (boarding start and end may, for example, be indicated by an input into the ACP 40), thereby causing the seat numbers to glow. Once boarding is completed, the logic circuitry 30 controls the lighting device 1204 to stop emitting the ultraviolet light (resulting in the seat numbers to stop glowing).

In another embodiment, each seat may have a small lighting device that emits ultraviolet light directed to the seat number to cause the seat number to glow when the passenger presses the call button. In another embodiment, a lighting device near the seat emit ultraviolet light of a first wavelength to light up quantum dots of a first color in the seat number during boarding, and emit light of a second wavelength to light up quantum dots of a second color in the seat number when the passenger presses the call button. In each case, the lighting devices could be control by logic circuitry. Other possible uses for this scheme include No Smoking/Fasten Seatbelt signs (e.g., on the bottom of the overhead bin) and a corporate logo (e.g., embedding in a wall of the cabin).

For the purposes of promoting an understanding of the principles of the LED lighting assembly described, reference has been made to the preferred embodiments illustrated in the drawings, and specific language has been used to describe these embodiments. However, no limitation of the scope of the described embodiments is intended by this specific language, and the LED lighting assembly should be construed to encompass all embodiments that would normally occur to one of ordinary skill in the art.

The example embodiments discussed above may be described in terms of functional block components and various processing steps. Such functional blocks may be realized by any number of hardware and/or software components configured to perform the specified functions. For example, the LED lighting assembly may employ various integrated circuit components, e.g., memory elements, processing elements, logic elements, and the like, which may carry out a variety of functions under the control of one or more microprocessors or other control devices. Similarly, where the elements of the described LED lighting assembly are implemented using software programming or software elements the LED lighting assembly may be implemented with any programming or scripting language such as C, C++, Java, assembler, or the like, with the various algorithms being implemented with any combination of data structures, objects, processes, routines or other programming elements. Furthermore, any number of conventional techniques for electronics configuration, signal processing and/or control, data processing and the like may be employed. The word mechanism is used broadly and is not limited to mechanical or physical embodiments, but can include software routines in conjunction with processors, etc.

The particular implementations shown and described herein are illustrative examples of the LED lighting assembly and are not intended to otherwise limit the scope in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice unless the element is specifically described as "essential" or "critical".

The use of the terms "a" and "an" and "the" and similar referents in the context of describing the LED lighting assembly (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context.

Numerous modifications and adaptations will be readily apparent to those skilled in this art without departing from the spirit and scope of the present disclosure.

What is claimed is:

1. An aircraft cabin lighting unit comprising:
    a plurality of quantum dot light-emitting diodes ("QLEDs"), including a first QLED of a first color and a second QLED of a second color;
    one or more light-emitting diodes ("LEDs"); and
    logic circuitry configured to:
        control the plurality of QLEDs to emit light in a first brightness ratio to create a light of a first metamer of a color,
        control the plurality of QLEDs to emit light in a second brightness ratio to create a light of a second metamer of the color, and
        control the LEDs to operate in conjunction with the plurality of QLEDs to create the light of the first metamer of the color and to create the light of the second metamer of the color.

2. An aircraft cabin lighting system comprising the lighting unit of claim 1 and an attendant control panel communicatively linked to the lighting unit, wherein the logic circuitry controls the lighting unit to create the first metamer of the color or the second metamer of the color in response to an input to the attendant control panel.

3. The lighting unit of claim 1, wherein the plurality of QLEDs further includes a third QLED of a third color.

4. The lighting unit of claim 3, wherein the plurality of QLEDs further includes a fourth QLED of a fourth color.

5. The lighting unit of claim 1, further comprising at least two phosphor LEDs, wherein the logic circuitry is further configured to:
    supply respective driving signals to each of the plurality of QLED and the at least two phosphor LEDs, the respective driving signals individually controlling relative intensity outputs of the respective QLEDs and the at least two phosphor LEDs; and
    display a desired color point by continuously driving the at least two phosphor LEDs while not driving at least one of the plurality of QLEDs.

6. An aircraft cabin lighting unit comprising:
    a plurality of quantum dot light-emitting diodes ("QLEDs"), including a first QLED of a first color and a second QLED of a second color;
    one or more phosphor light-emitting diodes ("LEDs"); and
    logic circuitry configured to:
        control the plurality of QLEDs to emit light in a first brightness ratio to create a light of a first metamer of a color;
        control the plurality of QLEDs to emit light in a second brightness ratio to create a light of a second metamer of the color;
        control the one or more phosphor LEDs to emit light of a first brightness in combination with the plurality of QLEDs to create the first metamer of the color; and
        control the one or more phosphor LEDs to emit light of a second brightness in combination with the plurality of QLEDs to create the second metamer of the color.

7. The lighting unit of claim 6, wherein the color of the first metamer and the second metamer is white.

8. An aircraft cabin lighting unit comprising:
    a plurality of quantum dot light-emitting diodes ("QLEDs"), including a first QLED of a first color and a second QLED of a second color; and
    logic circuitry configured to:
        control a first subset of the plurality of QLEDs to emit light at the same time in a first brightness ratio so as to create a first metamer of a color,
        control a second subset of the plurality of QLEDs to emit light at the same time in a second brightness ratio so as to create a second metamer of the color,
        wherein the first subset and the second subset do not overlap and each includes at least two QLEDs of different colors.

9. The lighting unit of claim 8, further comprising one or more phosphor LEDs, wherein the logic circuitry is further configured to control the one or more phosphor LEDs to emit light in combination with one or both the first subset and the second subset of QLEDs to create one or both the first metamer of the color and the second metamer of the color.

10. A lighting system for an aircraft cabin, the lighting system comprising:
    a cluster of quantum dots located on or near a visible surface within the aircraft cabin;
    a lighting device configured to emit light of a wavelength that is sufficient to excite the quantum dots to a state in which the quantum dots illuminate; and
    logic circuitry configured to control the lighting device to emit the light on a predetermined condition, thereby causing the quantum dots to illuminate.

11. The lighting system of claim 10, wherein the cluster of quantum dots is embedded in a transparent or translucent encapsulant that is disposed on a visible surface of the aircraft cabin.

12. The lighting system of claim 11, wherein
    the visible surface is on or near a passenger's seat,
    the encapsulant is shaped like a seat number, and
    the lighting device is disposed proximate to the encapsulant; and the predetermined condition is that passenger call button has been pressed.

13. The lighting system of claim 11, wherein
the visible surface is on or near a passenger's seat,
the encapsulant is shaped like a seat number, and
the predetermined condition is that the lighting system is in a passenger boarding mode.

14. The lighting system of claim 12, wherein the lighting device is configured to emit light of a first wavelength to light up quantum dots of a first color in the seat number during boarding, and emit light of a second wavelength to light up quantum dots of a second color in the seat number when the passenger presses the call button.

* * * * *